(12) United States Patent  (10) Patent No.: US 7,833,863 B1
Pattanayak et al.  (45) Date of Patent:  Nov. 16, 2010

(54) METHOD OF MANUFACTURING A CLOSED CELL TRENCH MOSFET

(75) Inventors: Deva N Pattanayak, Cupertino, CA (US); Robert Xu, Fremont, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 12/107,738

(22) Filed: Apr. 22, 2008

Related U.S. Application Data

(60) Continuation of application No. 11/040,129, filed on Jan. 20, 2005, now Pat. No. 7,361,558, which is a division of application No. 10/726,922, filed on Dec. 2, 2003, now Pat. No. 7,279,743.

(51) Int. Cl.
*H01L 21/336* (2006.01)
(52) U.S. Cl. ............... 438/270; 257/331; 257/E21.429
(58) Field of Classification Search .............. 438/270; 257/331, E21.429
See application file for complete search history.

(56) References Cited

U.S. PATENT DOCUMENTS

| | | | |
|---|---|---|---|
| 4,642,674 A | 2/1987 | Schoofs | |
| 4,663,644 A * | 5/1987 | Shimizu | 257/331 |
| 4,680,604 A | 7/1987 | Nakagawa et al. | |
| 4,760,431 A | 7/1988 | Nakagawa et al. | |
| 4,774,198 A | 9/1988 | Contiero et al. | |
| 4,775,879 A | 10/1988 | Robb et al. | |
| 4,777,521 A | 10/1988 | Coe | |
| 4,779,123 A | 10/1988 | Bencuya et al. | |
| 4,837,606 A | 6/1989 | Goodman et al. | |
| 4,916,085 A | 4/1990 | Frisina | |
| 5,136,349 A | 8/1992 | Yilmaz et al. | |
| 5,326,711 A | 7/1994 | Malhi | |
| 5,473,176 A | 12/1995 | Kakumoto | |
| 5,648,283 A | 7/1997 | Tsang et al. | |
| 5,742,076 A | 4/1998 | Sridevan et al. | |
| 5,760,440 A | 6/1998 | Kitamura et al. | |
| 5,770,514 A | 6/1998 | Matsuda et al. | |

(Continued)

FOREIGN PATENT DOCUMENTS

DE 10239310 3/2004

(Continued)

OTHER PUBLICATIONS

H Yilmaz et al., Insulated gate Transistor Modeling and Optimization, 1984, pp. 274-277 IEDM.

(Continued)

*Primary Examiner*—Steven J Fulk

(57) ABSTRACT

Embodiments of the present invention provide an improved closed cell trench metal-oxide-semiconductor field effect transistor (TMOSFET). The closed cell TMOSFET comprises a drain, a body region disposed above the drain region, a gate region disposed in the body region, a gate insulator region, a plurality of source regions disposed at the surface of the body region proximate to the periphery of the gate insulator region. A first portion of the gate region and the gate oxide region are formed as parallel elongated structures. A second portion of the gate region and the oxide region are formed as normal-to-parallel elongated structures. A portion of the gate and drain overlap region are selectively blocked by the body region, resulting in lower overall gate to drain capacitance.

16 Claims, 14 Drawing Sheets

U.S. PATENT DOCUMENTS

| | | | |
|---|---|---|---|
| 5,866,931 A | 2/1999 | Bulucea et al. | |
| 5,929,481 A | 7/1999 | Hshieh et al. | |
| 5,998,833 A | 12/1999 | Baliga | |
| 6,049,108 A | 4/2000 | Williams et al. | |
| 6,057,558 A * | 5/2000 | Yamamoto et al. | 257/77 |
| 6,133,587 A | 10/2000 | Takeuchi et al. | |
| 6,211,018 B1 | 4/2001 | Nam et al. | |
| 6,246,090 B1 | 6/2001 | Brush et al. | |
| 6,319,777 B1 | 11/2001 | Hueting et al. | |
| 6,346,438 B1 | 2/2002 | Yagishita et al. | |
| 6,413,822 B2 | 7/2002 | Williams et al. | |
| 6,511,885 B2 | 1/2003 | Harada et al. | |
| 6,627,950 B1 * | 9/2003 | Bulucea et al. | 257/329 |
| 6,649,975 B2 | 11/2003 | Baliga | |
| 6,737,704 B1 * | 5/2004 | Takemori et al. | 257/329 |
| 6,764,889 B2 | 7/2004 | Baliga | |
| 6,797,588 B2 | 9/2004 | Ishikawa et al. | |
| 6,838,730 B1 | 1/2005 | Kawaguchi et al. | |
| 6,891,223 B2 | 5/2005 | Krumrey et al. | |
| 6,906,380 B1 | 6/2005 | Pattanayak et al. | |
| 6,919,248 B2 | 7/2005 | Francis et al. | |
| 6,974,750 B2 | 12/2005 | Haase | |
| 7,344,945 B1 | 3/2008 | Pattanayak et al. | |
| 2001/0003367 A1 | 6/2001 | Hshieh et al. | |
| 2001/0023959 A1 | 9/2001 | Harada et al. | |
| 2002/0019099 A1 | 2/2002 | Williams et al. | |
| 2002/0125528 A1 | 9/2002 | Kawaguchi et al. | |
| 2003/0001203 A1 | 1/2003 | Ono et al. | |
| 2003/0006456 A1 | 1/2003 | Takahashi et al. | |
| 2003/0008460 A1 * | 1/2003 | Darwish | 438/268 |
| 2003/0062570 A1 | 4/2003 | Darwish et al. | |
| 2003/0178673 A1 | 9/2003 | Bhalla et al. | |
| 2004/0195618 A1 * | 10/2004 | Saito et al. | 257/330 |
| 2005/0287744 A1 | 12/2005 | Ono et al. | |

FOREIGN PATENT DOCUMENTS

| | | |
|---|---|---|
| EP | 0133642 | 3/1985 |
| EP | 1170803 | 1/2002 |
| JP | 57-206073 | 12/1982 |
| JP | 62-039069 | 2/1987 |
| JP | 63-252480 | 10/1988 |
| JP | 64-769 | 1/1989 |

OTHER PUBLICATIONS

Victor A. K. Temple, MOS-Controlled Thyristors—A New Class of Power Devices, Oct. 1986, 99. 1609-1618, IEEE, vol. ED-33, No. 10.

H. Yilmaz, Cell Geometry Effect on IGT Latch-Up, IEEE Electron Device Letters, vol. EDL-6, No. 8, Aug. 1985.

* cited by examiner

METHOD OF MANUFACTURING A CLOSED CELL TRENCH MOSFET

CROSS-REFERENCE TO RELATED APPLICATIONS

This is a continuation of U.S. patent application Ser. No. 11/040,129, filed Jan. 20, 2005, which is a divisional of U.S. patent application Ser. No. 10/726,922, filed Dec. 2, 2003.

BACKGROUND OF THE INVENTION

Referring to FIG. 1, a cross sectional perspective view of a striped trench metal-oxide-semiconductor field effect transistor (TMOSFET) 100 according to the conventional art is shown. The striped TMOSFET 100 comprises a plurality of source contacts 110, a plurality of source regions 115, a plurality of gate regions 120, a plurality of gate insulator regions 125, a plurality of body regions 130, a drain region 135, 140 and drain contact 145. The drain region 135, 140 may optionally include a first drain portion 140 and a second drain portion 135.

The body regions 130 are disposed above drain region 135, 140. The source regions 115, gate regions 120 and the gate insulator regions 125 are disposed within the body regions 130. The gate regions 120 and the gate insulator regions 125 are formed as parallel-elongated structures. The gate insulator region 125 surrounds the gate region 120. Thus, the gate regions 120 are electrically isolated from the surrounding regions by the gate insulator regions 125. The gate regions 120 are coupled to form a common gate of the device 100. The source regions 115 are formed as parallel-elongated structures along the periphery of the gate insulator regions 125. The source regions 115 are coupled to from common source of the device 100, by the source contacts 110. Although shown as a plurality of individual source contacts 110, it is appreciated that the source contacts 110 may be implemented as a single conductive layer coupling all the source regions 115. The source contacts 110 also couple the source regions 115 to the body regions 130.

The source regions 115 and the drain region 140 are heavily n-doped (N+) semiconductor, such as silicon doped with phosphorous or arsenic. The body regions 130 are p-doped (P) semiconductor, such as silicon doped with boron. The gate region 120 is heavily n-doped (N+) semiconductor, such as polysilicon doped with phosphorous. The gate insulator regions 125 may be an insulator, such as silicon dioxide.

When the potential of the gate regions 120, with respect to the source regions 115, is increased above the threshold voltage of the device 100, a conducting channel is induced in the body region 130 along the periphery of the gate insulator regions 125. The striped TMSOFET 100 will then conduct current between the drain region 140 and the source regions 115. Accordingly, the device is in its on state.

When the potential of the gate regions 120 is reduced below the threshold voltage, the channel is no longer induced. As a result, a voltage potential applied between the drain region 140 and the source regions 115 will not cause current to flow there between. Accordingly, the device 100 is in its off state and the junction formed by the body region 130 and the drain region 140 supports the voltage applied across the source and drain.

If the drain region 135, 140 comprises a second drain portion 135 disposed above a first drain portion 140, the second portion of the drain region 135 is lightly n-doped (N−) semiconductor, such as silicon doped with phosphorous or arsenic, and the first portion of the drain region 140 is heavily n-doped (N+) semiconductor, such as silicon doped with phosphorous or arsenic. The lightly n-doped (N−) second portion of the drain region 135 results in a depletion region that extends into both the body regions 130 and the second portion of the drain region 135, thereby reducing the punch through effect. Accordingly, the lightly n-doped (N−) second portion of the drain region 135 acts to increase the breakdown voltage of the striped TMOSFET 100.

The channel width of the striped TMOSFET 100 is a function of the width of the plurality of the source regions 115. Thus, the striped TMOSFET 100 provides a large channel width to length ratio. Therefore, the striped TMOSFET may advantageously be utilized for power MOSFET applications, such as switching elements in a pulse width modulation (PWM) voltage regulator.

Referring to FIG. 2, a cross sectional perspective view of a closed cell trench metal-oxide-semiconductor field effect transistor (TMOSFET) 200 according to the conventional art is shown. The closed cell TMOSFET 200 comprises a plurality of source contacts 210, a plurality of source regions 215, a gate region 220, a gate insulator region 225, a plurality of body regions 230, a drain region 235, 240 and a drain contact 245. The drain region 235, 240 may optionally include a first drain portion 240 and a second drain portion 235.

The body regions 230, the source regions 215, the gate region 220 and the gate insulator region 225 are disposed above the drain region 235, 240. A first portion of the gate region 220 and the gate insulator region 225 is formed as substantially parallel-elongated structures 221. A second portion of the gate region 220 and the gate insulation region 225 is formed as substantially normal-to-parallel elongated structures 222. The first and second portions of the gate region 220 are all interconnected and form a plurality of cells. The body regions 230 are disposed within the plurality of cells formed by the gate region 220.

The gate insulator region 225 surrounds the gate region 220. Thus, the gate region 220 is electrically isolated from the surrounding regions by the gate insulator region 225. The source regions 215 are formed in the plurality of cells, along the periphery of the gate insulator region 225.

The source regions 215 are coupled to form a common source of the device 200, by the source contacts 210. Although shown as a plurality of individual source contacts 210, it is appreciated that the source contacts 210 may be implemented as a plurality of conductive strips each coupling a plurality of source regions 215, a single conductive layer coupling all the source regions 215, or the like. The source contacts 210 also couple the source regions 215 to the body regions 230.

The source regions 215 and the drain region 240 are heavily n-doped (+N) semiconductor, such as silicon doped with phosphorous or arsenic. The body regions 230 are p-doped (P) semiconductor, such as silicon doped with boron. The gate region 220 is heavily n-doped semiconductor (N+), such as polysilicon doped with phosphorous. The gate insulator region 225 may be an insulator, such as silicon dioxide.

When the potential of the gate region 220, with respect to the source regions 215, is increased above the threshold voltage of the device 200, a conducting channel is induced in the body region 230 along the periphery of the gate insulator region 225. The device 200 will then conduct current between the drain region 240 and the source regions 215. Accordingly, the device 200 is in its on state.

When the potential of the gate region 220 is reduced below the threshold voltage, the channel is no longer induced. As a result, a voltage potential applied between the drain region 240 and the source regions 215 will not cause current to flow there between. Accordingly, the device is in its off state and the function formed by the body region 230 and the drain region 240 supports the voltage applied across the source and drain.

If the drain region 235, 240 comprises a second portion 235 disposed above a second portion 240, the second portion of the drain region 235 is lightly n-doped (N−) semiconductor, such as silicon doped with phosphorous or arsenic, and the first portion of the drain region 240 is heavily n-doped (N+) semiconductor, such as silicon doped with phosphorous. The lightly n-doped (N−) second portion of the drain region 235 results in a depletion region that extends into both the body regions 230 and the second portion of the drain region 235, thereby reducing the punch through effect. Accordingly, the lightly n-doped (N−) second portion of the drain region 235 acts to increase the breakdown voltage of the closed cell TMOSFET 200.

The channel width of the closed cell TMOSFET 200 is a function of the sum of the width of the source regions 215. Thus, the closed cell TMOSFET 200 geometry advantageously increases the width of the channel region, as compared to the striped TMOSFET 100. Accordingly, the closed cell TMSOFET 200 has a relatively low channel resistance (e.g., on resistance), as compared to the striped TMOSFET 100 geometry. The low channel resistance reduces power dissipated in the closed cell TMOSFET 200, as compared to the striped TMOSFET 100.

Similarly, the gate-to-drain capacitance of the closed cell TMOSFET 220 is a function of the area of overlap between the bottom of the gate region 220 and the drain region 240. Accordingly, the closed cell TMOSFET 200 geometry suffers from a higher gate-to-drain capacitance, as compared to the striped TMOSFET 100. The relatively high gate to drain capacitance limits the switching speed of the closed cell TMOSFET 200, as compared to the striped TMOSFET 100.

SUMMARY OF THE INVENTION

Accordingly, embodiments of the present invention provide an improved closed cell trench metal-oxide-semiconductor field effect transistor (TMOSFET). Embodiments of the present invention provide a closed cell TMOSFET having a low on resistance, as compared to an equivalent striped cell TMOSFET. Further, embodiments of the present invention provide a closed cell TMOSFET having a low gate-to-drain capacitance.

Embodiments of the present invention provide a closed cell TMOSFET comprising a combination of open gate-drain regions, arranged in a first plurality of parallel regions, and closed gate-drain regions, arranged in a second plurality of parallel regions normal to the open gate-drain regions.

More specifically, embodiments of the present invention provide a closed cell TMOSFET comprising a drain, a body region disposed above the drain region, a gate region disposed in the body region, a gate insulator region disposed above the gate region, a plurality of source regions disposed at the surface of the body region proximate to the periphery of the gate insulator region. A first portion of the gate region and the gate insulator region are formed as parallel-elongated structures. A second portion of the gate region and the gate insulator region are formed as normal-to-parallel elongated structures (e.g., in the plane of the surface of the body region, the second portion comprise a plurality of parallel elongated structures formed at right angles to the first portion of the gate region and gate insulator region). The body region selectively blocks a portion of the overlapping gate region and drain region.

Embodiments of the present invention also provide a method of fabricating a closed cell TMOSFET having a plurality of open trench bottom portions and a plurality of closed trench bottom portions. The method of fabrication comprises growing a lightly n-doped epitaxial silicon layer on a heavily n-doped silicon substrate. The epitaxial deposited silicon layer is selectively etched to form a first set of parallel trenches and a second set of parallel trenches normal-to-parallel to the first set of trenches. The silicon proximate the first and second set of trenches is oxidized to form a gate oxide region. A p-type impurity is implanted in the first set of parallel trench bottoms. The p-type impurity is not implanted in the second set of parallel trenches, which are perpendicular to the first set. The first and second sets of trenches are filed with polysilicon to form a gate region therein. A top portion of the lightly n-doped epitaxial silicon layer is implanted with a p-type impurity to form a p-doped body. A portion of the body region proximate the periphery of the gate oxide region is implanted to form a heavily n-doped source region.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
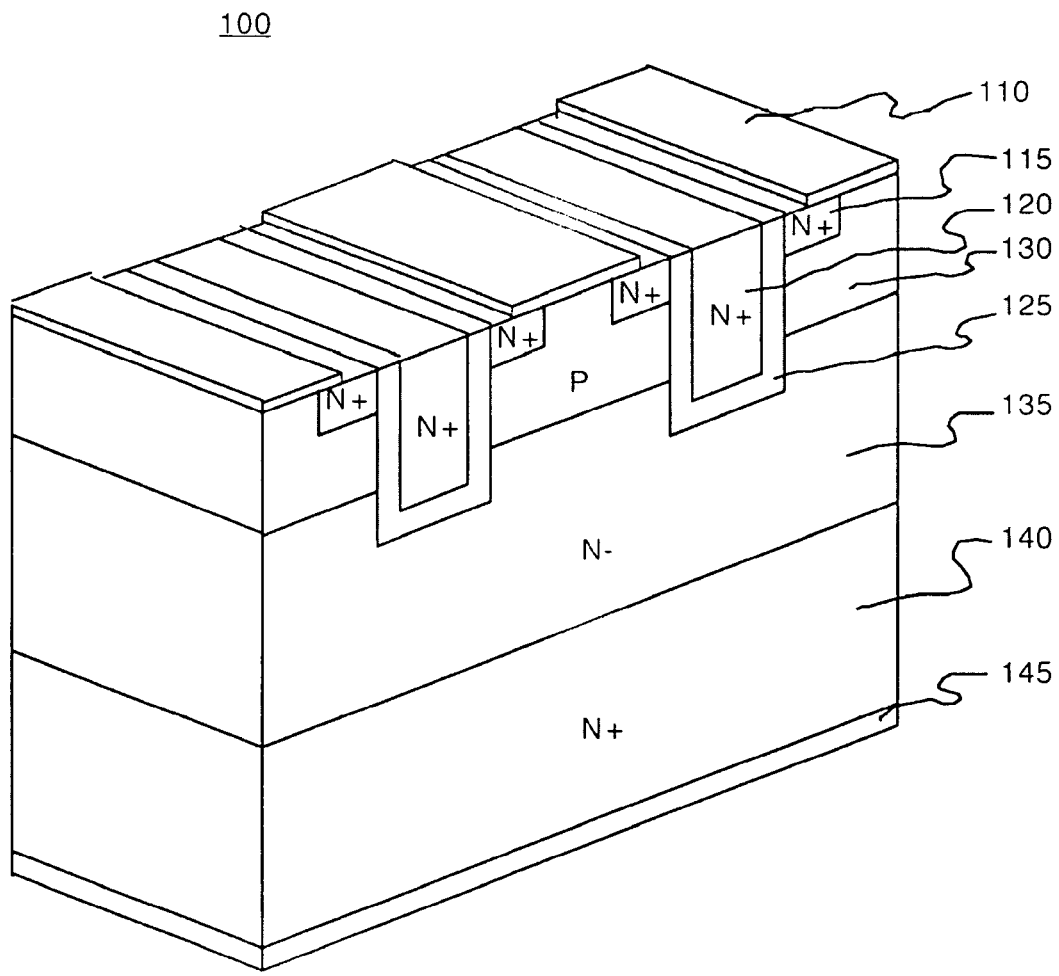
FIG. 1 shows a cross sectional perspective view of a striped trench metal-oxide-semiconductor field effect transistor (TMOSFET) according to the conventional art.
Figure 2:
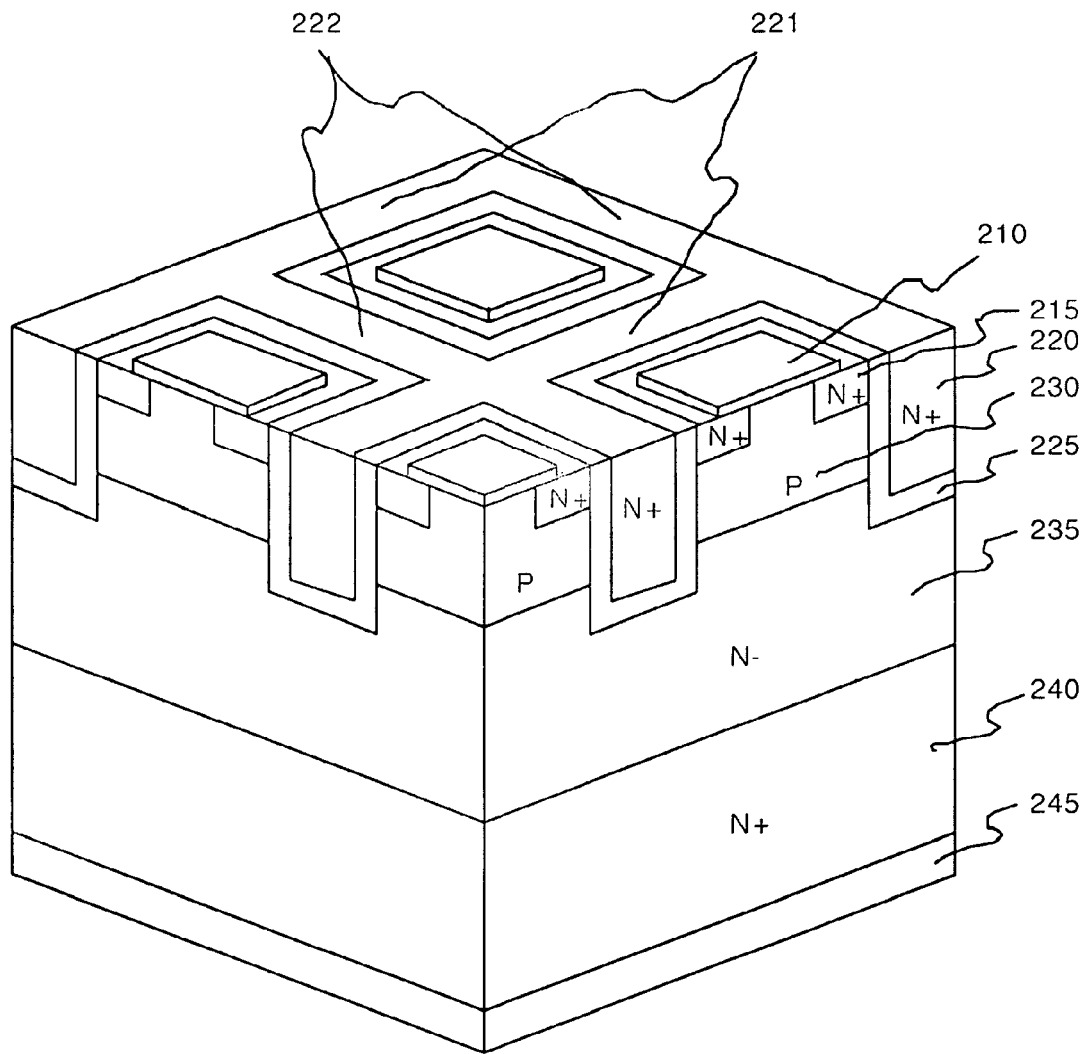
FIG. 2 shows a cross sectional perspective view of a closed cell TMOSFET according to the conventional art.
Figure 3A:
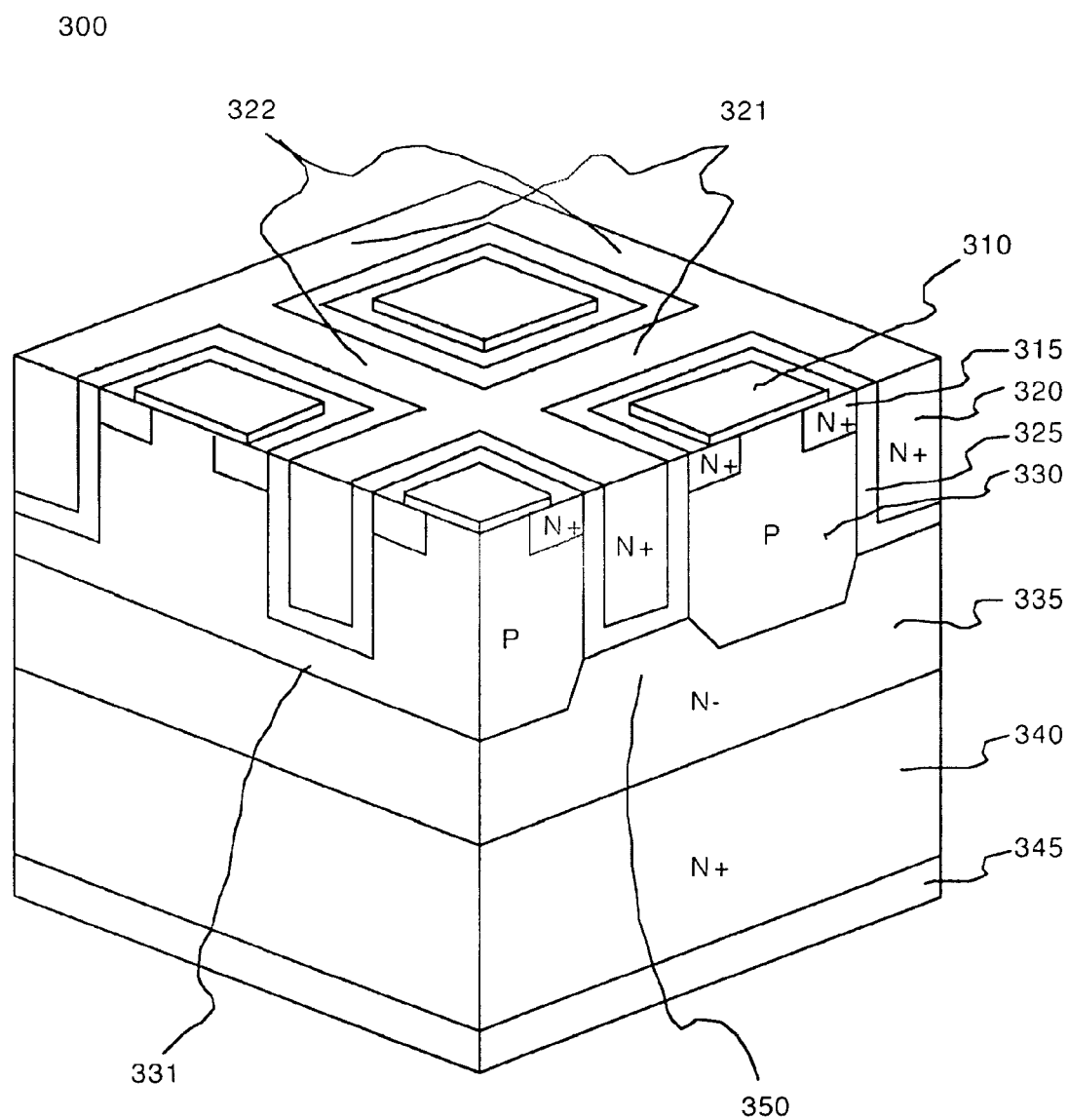
FIG. 3A shows a cross sectional perspective view of a closed cell TMOSFET, in accordance with one embodiment of the present invention.

Referring to FIG. 3A, a cross sectional perspective view of a closed cell trench metal-oxide-semiconductor field effect transistor (TMOSFET) 300, in accordance with one embodiment of the present invention, is shown. The closed cell TMOSFET 300 comprises a plurality of source contacts 310, a plurality of source regions 315, a gate region 320, a gate insulator region 325, a body region 330, a drain region 335, 340 and a drain contact 345. The drain region 335, 340 may optionally include a first drain portion 340 and a second drain portion 335.

The body regions 330, the source regions 315, the gate region 320 and the gate insulator region 325 are disposed above the drain region 335, 340. A first portion of the gate region 320 and the gate insulator region 325 are formed as substantially parallel-elongated structures 321. A second portion of the gate region 320 and the gate insulation region 325 are formed as substantially normal-to-parallel elongated structures 322 (e.g., in the plane of the surface of the body region, the second portion comprise a plurality of substantially parallel elongated structures formed at right angles to the first portion of the gate region and gate insulator region). The first and second portions of the gate region 320 are all interconnected and form a plurality of cells. The body regions 330 are disposed within the plurality of cells formed by the gate region 320. A third portion 350 of the drain region 335, 340 extends to the bottom of the first portion of the gate insulator region 325.

Accordingly, the closed cell TMOSFET 300, in accordance with embodiments of the present invention, comprises a plurality of open gate-drain regions 331 (e.g., selectively blocked by a portion of the body region 330) arranged with respect to the second plurality of parallel structures 322. The closed cell TMOSFET 300 further comprises a plurality of closed gate-drain regions 350 (e.g., the drain region 335 overlaps the gate region 320) arranged with respect to the first plurality of parallel structures 321 that are normal to the open gate-drain regions 331.

The gate insulator region 325 surrounds the gate region 320. Thus, the gate region 320 is electrically isolated from the surrounding regions by the gate insulator region 325. The source regions 315 are formed in the plurality of cells, along the periphery of the gate insulator region 325. The source regions 315 are coupled to form a common source of the device, by the source contacts 310. The source contacts 310 also couple the source regions 315 to the body region 330.

In one implementation, the source regions 315 and the drain region 335, 340 are heavily n-doped (N+) semiconductor, such as silicon doped with phosphorous or arsenic. The body region 330 is p-doped (P) semiconductor, such as silicon doped with boron. The gate region 320 is heavily n-doped (N+) semiconductor, such as polysilicon doped with phosphorous. The gate insulator region 325 may be an oxide, such as silicon dioxide or the like.

When the potential of the gate region 320, with respect to the source regions 315, is increased above the threshold voltage of the device 300, a conducting channel is induced in the body region 330 along the periphery of the gate insulator region 325. The device 300 will then conduct current between the drain region 340 and the plurality of source regions 315. Accordingly, the device 300 is in is on state. Charge flows from the proximity of the extended portion of the drain region 350, which overlaps the bottom of the first portion of the gate region 320, through the induced channel proximate the first portion of the gate region 320, and into the source regions 315. Charge also raps around from the proximity of the extended portion of the drain region 350, which overlaps the bottom of the first portion of the gate region 320, through the induced channel proximate the second portion of the gate insulator region 320, and into the source regions 315.

When the potential of the plurality of gate regions 320 is reduced below the threshold voltage, the channel is no longer induced. As a result, a voltage potential applied between the drain region 335, 340 and the source regions 315 will not cause current to be conducted there between. Accordingly, the device 300 is in its off state and the junction of the body region 330 and the drain region 335, 340 supports the voltage applied across the source region 315 and the drain region 335, 340.

If the drain region 335, 340 comprises a second drain portion 335 disposed above a first portion 340 of the drain region, the second portion of the drain region 335 is lightly n-doped (−N) semiconductor, such as silicon doped with phosphorous or arsenic, and the first portion of the drain region 340 is heavily n-doped (N+) semiconductor, such as silicon doped with phosphorous. The lightly n-doped (−N) second portion of the drain region 335 results in a depletion region that extends into both the body region 330 and the second portion of the drain region 335, thereby reducing the punch through effect. Thus, the lightly n-doped (−N) second portion of the drain region 335 acts to increase the breakdown voltage of the closed cell TMOSFET 310.

The width of the channel remains a function of the sum of the lengths of the source regions 315. Hence, the width of the channel region is substantially equal to the legacy closed cell TMOSFET 200. Therefore, the on resistance (Rds-on) of the device 300 is substantially equal to the legacy closed cell TMOSFET 200.

The induced channel comprises a gate-to-source capacitance. The gate region 320, the gate insulator region 325 and the drain region 335, 340 also comprise a gate-to-drain capacitance. The portions of the body region 331 disposed between the drain region 335, 340 and the second portion of the gate region 320 and gate insulator region 325 acts to reduce the gate-to-drain capacitance (Cgd) of the device 300. However, the reduction of the gate-to-drain capacitance causes an increase in the gate-to-source capacitance (Cgs). The charge in the gate region 320, which in a legacy device would have coupled to charge in the drain region 335, 340, now acts to increase the induced channel, and hence the capacitance between the source and gate. The body 330 and source 315 are couple together, and therefore effectively increases the gate to source capacitance.

The closed cell TMOSFET 300, in accordance the present embodiment, advantageously provides a low gate-to-drain capacitance (Cgd) to gate-to-source capacitance (Cgs) ratio, as compared to the legacy closed cell TMOSFET 200. Furthermore, the closed cell TMOSFET 300, in accordance with the present embodiment, advantageously provides an improved Rds-on*Qgd figure of merit, as compared to both the legacy striped TMOSFET 100 and the legacy closed cell TMOSFET 200.

Figure 3B:
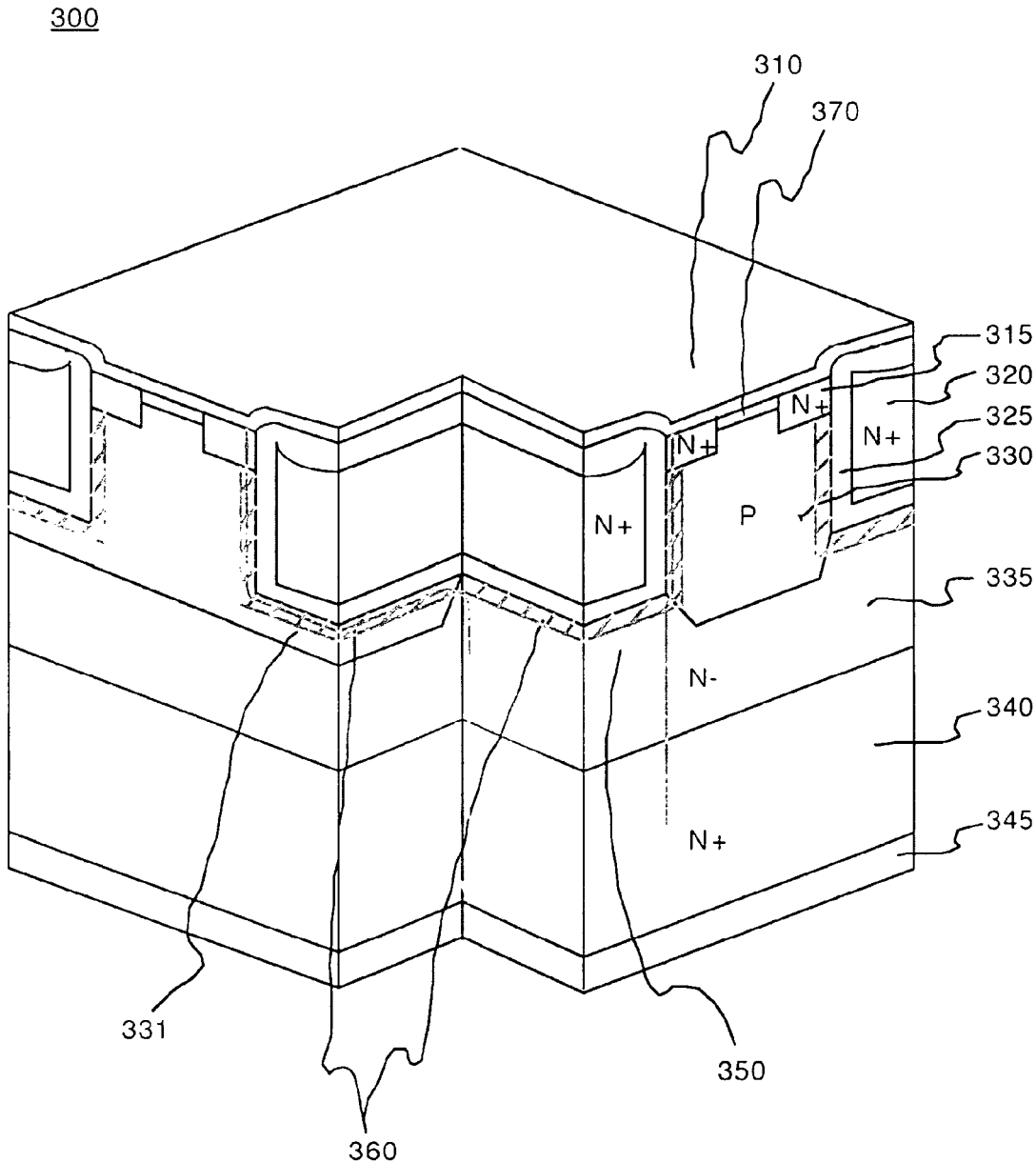
FIG. 3B a cross sectional perspective view of a closed cell TMOSFET, in accordance with one embodiment of the present invention.

Referring to FIG. 3B, a cross sectional perspective view of a closed cell trench metal-oxide-semiconductor field effect transistor (TMOSFET) 300, in accordance with one embodiment of the present invention, is shown. The front corner of the cross sectional perspective view is cut away to show that the parallel and normal-to-parallel elongated structures of the drain region 320 are all interconnected.

FIG. 3B illustrates the induced channel 360 and the flow of charge 380, 318 in the on state of the TMOSFET 300. When the potential of the gate region 320, with respect to the source regions 315, is increased above the threshold voltage of the device 300, the conducting channel 360 is induced in the body region 330 along the periphery of the gate insulator region 325. The device 300 will then conduct current between the drain region 340 and the plurality of source regions 315. Charge flows 380 from the proximity of the extended portion of the drain region 350, which overlaps the bottom of the first portion of the gate region, through the induced channel 360 proximate the first portion of the gate region 320, and into the source regions 315. Charge 381 also raps around from the proximity of the extended portion of the drain region 350, which overlaps the bottom of the first portion of the gate region 320, through the induced channel proximate the second portion of the gate insulator region 320, and into the source regions 315. Accordingly, a component of the current flows from the induced channel 360 in the portions of the body region 331, disposed between the drain region 335, 340 and the second portion of the gate region 320 and gate insulator region 325, and into the extended portion of the drain region 350. This component of the current acts to decrease the Rds-on of the TMOSFET 300, as compared to the conventional striped TMOSFET.

Furthermore, FIG. 3B illustrates the source contact 310 implemented as a single conductive layer coupling all the source regions 315, or the like. In such an embodiment the gate insulator region 325 is also disposed between the gate region 320 and the source contact 310.

The TMOSFET 300 includes a source contact region 370. The source contact region 370 comprises heavily p-doped (P+) semiconductor, such as silicon doped with boron. The source contact region 370 provides a low ohmic contact between the source contact 315 and the body region 330.

Figure 4:
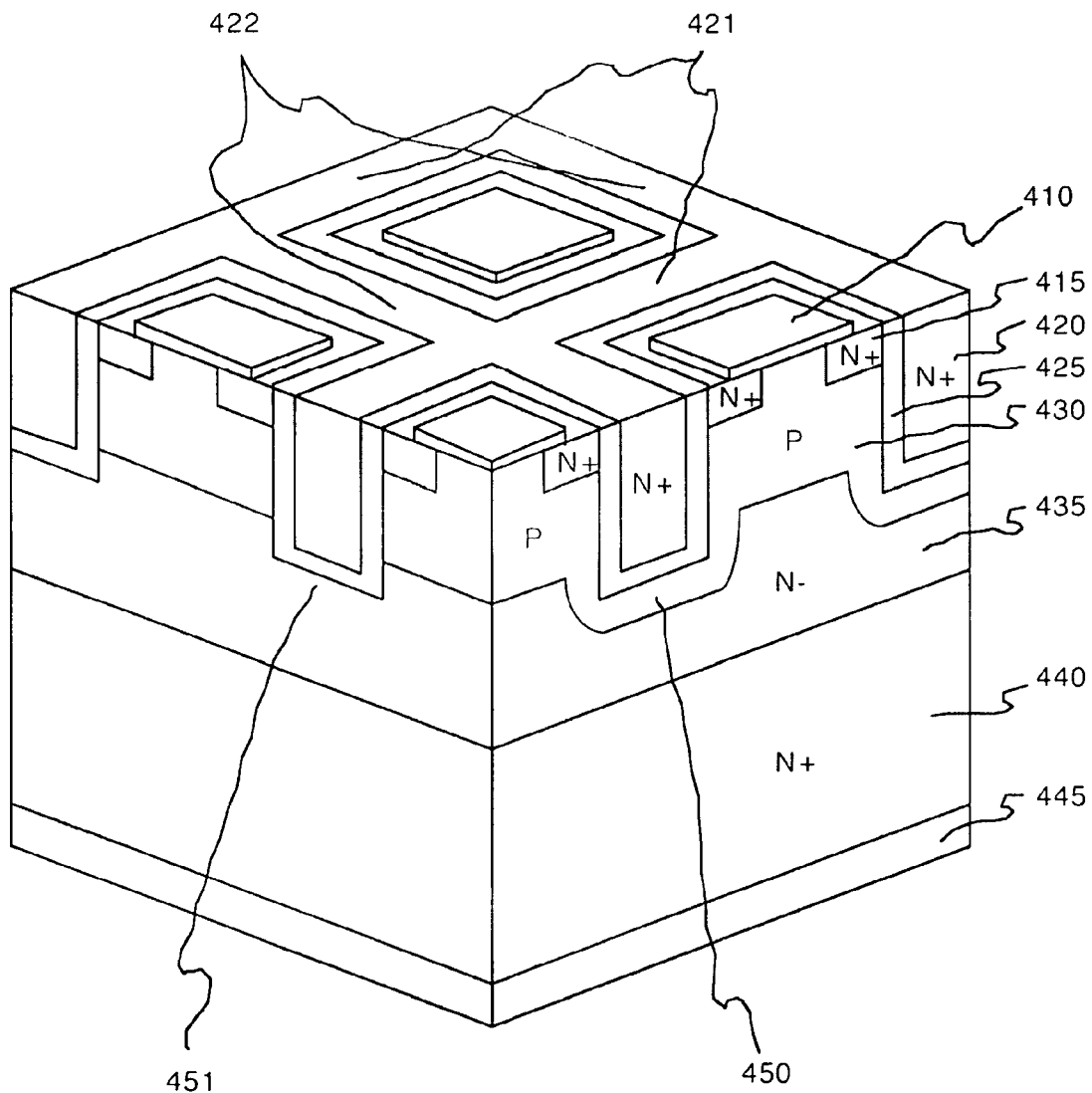
FIG. 4 shows a cross sectional perspective view of another closed cell TMOSFET, in accordance with one embodiment of the present invention.

Referring to FIG. 4, a cross sectional perspective view of a closed cell trench metal-oxide-semiconductor field effect transistor (TMOSFET) 400, in accordance with one embodiment of the present invention, is shown. The closed cell TMOSFET 400 comprises a plurality of source contacts 410, a plurality of source regions 415, a gate region 420, a gate insulator region 425, a body region 430, a drain region 335, 440 and a drain contact 445. The drain region 435, 440 may optionally include a first drain portion 440 and a second drain portion 435.

The body region 430 is disposed above the drain region 435, 440. The source regions 415, the gate region 420 and the gate insulator region 425 are disposed within the body region 430. A first portion of the gate region 420 and the gate insulator region 425 are formed as substantially parallel elongated structures 421. A second portion of the gate region 420 and the gate insulation region 425 are formed as substantially normal-to-parallel elongated structures 422. The first and second portions of the gate region 420 are all interconnected and form a plurality of cells. The body region 430 is disposed within the plurality of cells formed by the gate region 420, with a portion of the body regions 450 surrounding the first portion of the gate region 421.

Accordingly, the closed cell TMOSFET 400, in accordance with embodiments of the present invention, comprises a plurality of open gate-drain regions 450 (e.g., selectively blocked by a portion of the body region 430 that encircles the gate region 420) arranged in a first plurality of parallel structures 421. The closed cell TMOSFET 400 further comprises a plurality of closed gate-drain regions 451 (e.g., the drain region 435 overlaps the gate region 420) arranged in a second plurality of parallel structures 422 that are normal to the open gate-drain regions 450.

The gate insulator region 425 surrounds the gate region 420. Thus, the gate region 420 is electrically isolated from the surrounding regions by the gate insulator region 425. The source regions 415 are formed in the plurality of cells, along the periphery of the gate insulator region 425. The source regions 415 are coupled to form a common source of the device, by the source contacts 410. Although shown as a plurality of individual source contacts 410, it is appreciated that the source contacts 410 may be implemented as a single conductive layer coupling all the source regions 415. The source contacts 410 also couple the source regions 415 to the body region 430.

In one implementation, the source regions 415 and the drain region 435, 440 are heavily n-doped (N+) semiconductor, such as silicon doped with phosphorous or arsenic. The body region 430 is p-doped (P) semiconductor such as silicon doped with boron. The gate region 420 is heavily n-doped (N+) semiconductor, such as polysilicon doped with phosphorous. The gate insulator region 425 may be an oxide, such as silicon dioxide.

The TMOSFET 400 may optionally include a source contact region (not shown). The source contact region comprises heavily p-doped (P+) semiconductor, such as silicon doped with boron. The source contact region provides a low ohmic contact between the source contact 410 and the body region 430.

When the potential of the plurality of gate regions 420, with respect to the source regions 415, is increased above the threshold voltage of the device 400, a conducting channel is induced in the body region 430 along the periphery of the gate insulator regions 425. The device 400 will then conduct current between the drain region 440 and the plurality of source regions 415. Accordingly, the device 400 is in its on state. Charge flows from the proximity of the portion of the drain region 451, which overlaps the bottom of the second portion of the gate region 420, through the induced channel proximate the second portion of the gate region 420, and into the source regions 415. Charge also raps around from the proximity of the portion of the drain region 451, which overlaps the bottom of the second portion of the gate region 420, through the induced channel proximate the first portion of the gate region 420, and into the source regions 415.

When the potential of the plurality of gate regions 420 is reduced below the threshold voltage, the channel is no longer induced. As a result, a voltage potential applied between the drain region 435, 440 and the plurality of source regions 415 will not cause charge to be conducted there between. Accordingly, the device 400 is in its off state and the junction of the body region 430 and the drain region 435, 440 supports the voltage applied across the source region 415 and the drain region 435, 440.

If the drain region 435, 440 comprises a second portion 435 disposed above a first portion 440, the second portion of the drain region 435 is lightly n-doped (−N) semiconductor, such as silicon doped with phosphorous or arsenic, and the first portion of the drain region 440 is heavily n-doped (N+) semiconductor, such as silicon doped with phosphorous. The lightly n-doped (−N) second portion of the drain region 435 results in a depletion region that extends into both the body region 430 and the second portion of the drain region 435, thereby reducing the punch through effect. Thus, the lightly n-doped (−N) second portion of the drain region 435 acts to increase the breakdown voltage of the closed cell TMOSFET 410.

The width of the channel remains a function of the sum of the lengths of the source regions 415. Hence, the width of the channel is substantially equal to the legacy closed cell MOSFET. Therefore, the on resistance (Rds-on) of the device 400 is substantially equal to the legacy closed cell MOSFET 200.

The induced channel comprises a gate-to-source capacitance. The gate region 420, the gate insulator region 425 and the drain region 440 also comprise a gate-to-drain capacitance. The portions of the body region 450 disposed between the drain region 435, 440 and the first portion of the gate region 420 and gate insulator region 425 acts to reduce the gate-to-drain capacitance (Cgd). However, the reduction of the gate-to-drain capacitance causes an increase in the gate-to-source capacitance (Cgs). The charge in the gate region 420, which in a legacy device would have coupled to charge in the drain region 435, 440, now acts to increase the induced channel, and hence the capacitance between the body and gate. The body 430 and sources 4115 are coupled together, and therefore the increased gate-to-body capacitance effectively increases the gate-to-source capacitance (Cgs).

The closed cell TMOSFET 400, in accordance with the present embodiment, advantageously provides a low gate-to-drain capacitance (Cgd) to gate-to-source capacitance (Cgs) ratio, as compared to the legacy closed cell TMOSFET 200. Furthermore, the closed cell TMOSFET 400, in accordance with the present embodiment, advantageously provides an improved Rds-on*Qgd figure of merit, as compared to both the legacy striped TMOSFET 100 and the legacy closed cell TMOSFET 200.

Figure 5A:
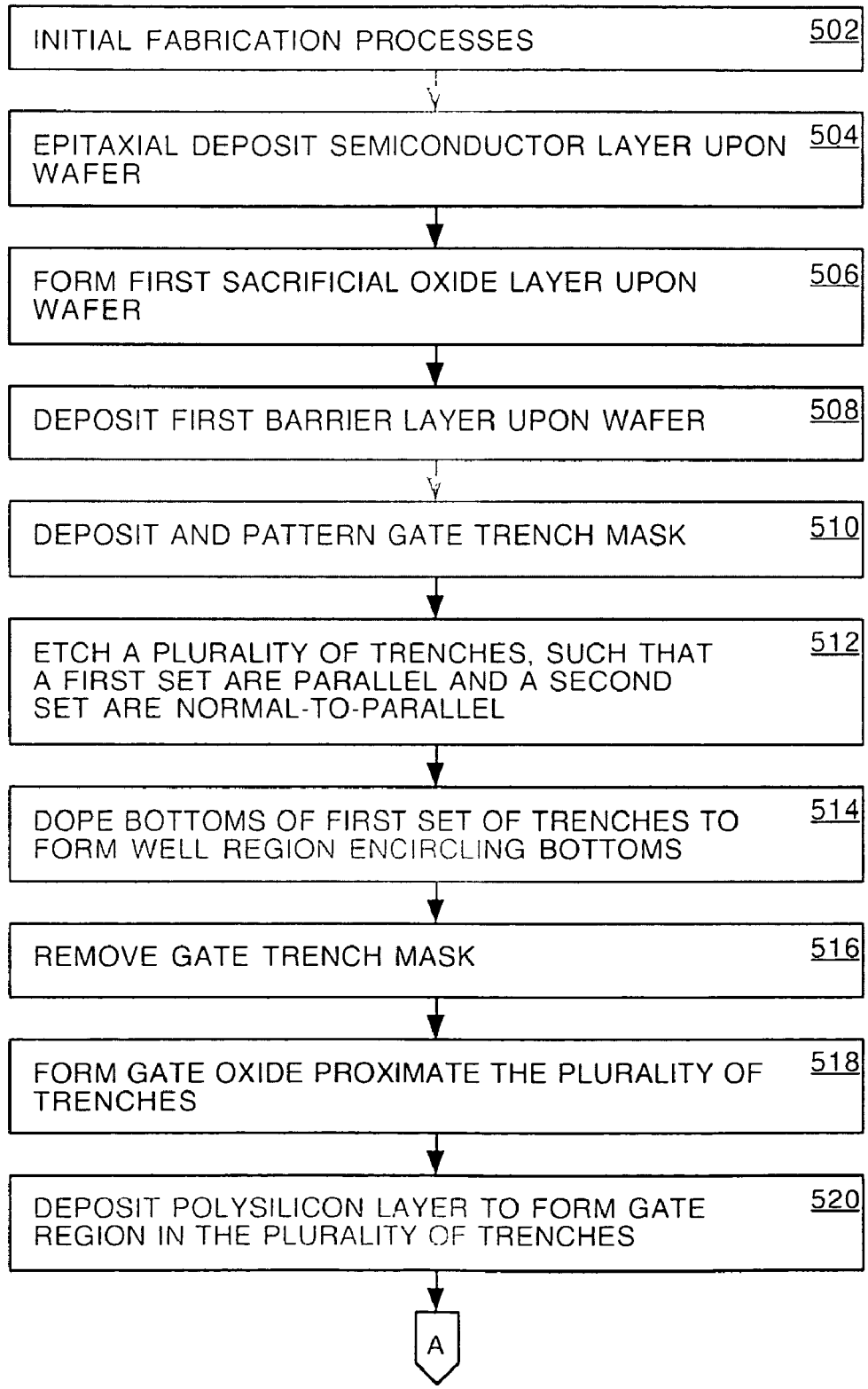
FIGS. 5A-5C show a flow diagram of a method of fabricating a closed cell TMOSFET, in accordance with one embodiment of the present invention.
Figure 5B:
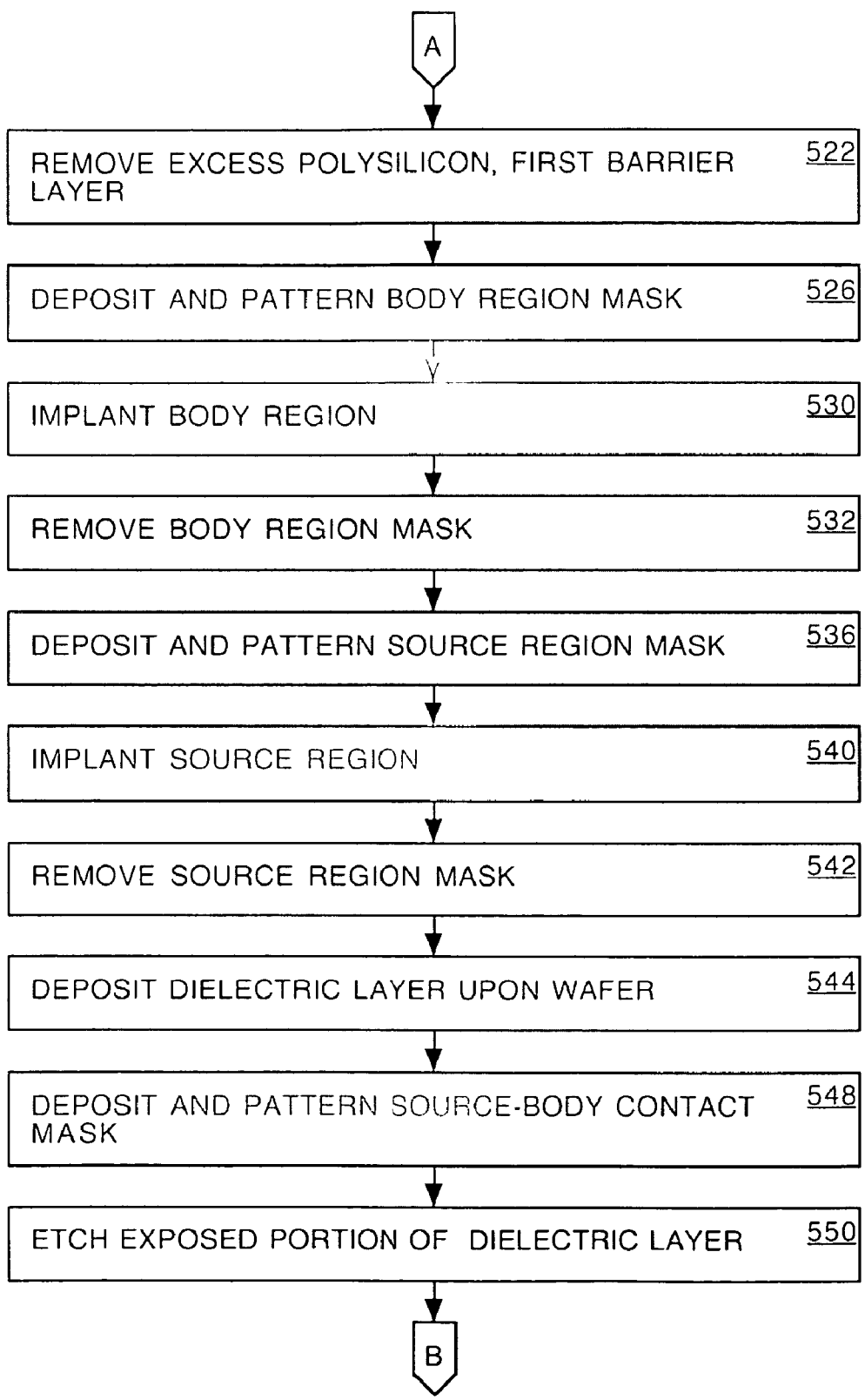
Figure 5C:
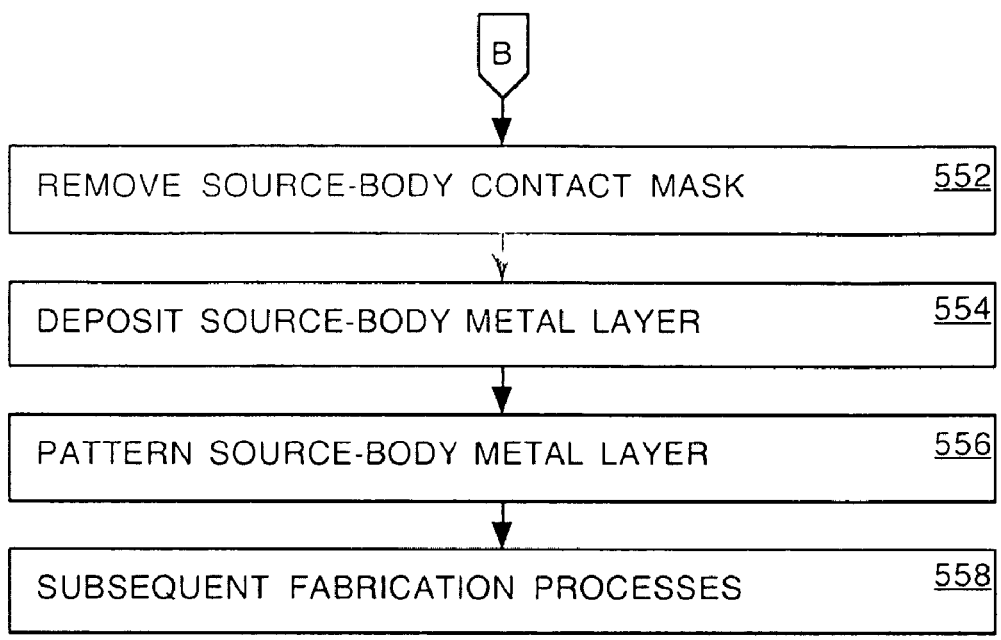

Referring now to FIGS. 5A-5C, a flow diagram of a method of fabricating a closed cell trench metal-oxide-semiconductor field effect transistor (TMOSFET), in accordance with one embodiment of the present invention, is shown. As depicted in FIGS. 5A-5C, the process begins, at 502, with various initial processes upon a substrate, such as cleaning, depositing, doping, etching and or the like. The semiconductor substrate comprises a first portion of a heavily doped drain region. In one implementation, the first portion of the drain region comprises silicon heavily doped with phosphorous (N+).

At 504, a semiconductor layer is epitaxial deposited upon the substrate. In one implementation, the semiconductor layer comprises silicon lightly doped with phosphorous. The epitaxial deposited silicon may be doped by introducing the desired impurity, such as phosphorous, into the reaction chamber.

At 506, a sacrificial oxide layer is formed upon the epitaxial deposited semiconductor layer. In one implementation, the sacrificial oxide is formed by oxidizing the surface of the epitaxial deposited silicon layer. At 508, a barrier layer is deposited upon the sacrificial oxide layer. In one implementation, the barrier layer is deposited by chemical vapor deposition (CVD) of silicon nitride ($SiN_4$). At 510, a photo-resist is deposited and patterned by any-well know lithography process to form a gate trench mask.

At 512, the exposed portions of the barrier layer, sacrificial oxide layer and a portion of the first semiconductor layer are etched by any-well known isotropic etching method. In one implementation, an ionic etchant interacts with the barrier layer, sacrificial oxide layer and first semiconductor layer exposed by the patterned resist layer. A plurality of trenches are formed, such that a first set of trenches are substantially parallel to each other and a second set of trenches are substantially normal-to-parallel with respect to the first set of trenches.

At 514, a trench bottom doping is performed in the first set of the trenches. In one implementation a p-type impurity, such as boron, is selectively implanted utilizing any well-known ion-implant process. The doping process results in the formation of a p-doped well region that encircles the bottoms of the first set of trenches.

In one embodiment, the implant ion flux is oriented at an angle with respect to the plane of the wafer. The angle of incident is selected such that the impurity is implanted in the first set of trench bottoms, while the second set of trench bottoms are not doped. More specifically, if the surface of the barrier layer lies in an x-y plane, the first set of trenches lie in x-z planes and the second set of trenches lie in y-z planes, the angle of orientation is such that the ion flux travels in the x and z directions and not in the y direction. Accordingly, the dopant reaches the bottoms of the first set of trenches. The barrier layer and/or the sacrificial oxide layers, however, capture the dopant along the second set of trenches. Thus, the dopant does not reach the bottoms of the second set of trenches. The angle of incident is selected as a function of the width the trenches and the thickness of the barrier and/or sacrificial oxide layer. Utilizing an ion implant process wherein the ion flux is incident upon the wafer at an appropriate angle is advantageous in that the patterned photo-resist, barrier layer and sacrificial oxide layer are utilized as a mask for both the etching process of 512, the implanting of 514 and the subsequent oxidation process of 518. Utilizing an ion implant process wherein the ion flux is incident upon the wafer at an appropriate angle is also advantageous in that the trench implant is self-aligned with the first set of tranches, and the second set of trench bottoms are not doped.

In another embodiment, the patterned resist, barrier layer, and sacrificial oxide layer are striped. Another sacrificial oxide layer, barrier layer and resist are deposited and patterned such that only the first set of trenches are exposed. The ion-implant process is then performed such that the angle of incident of the ion flux is substantially normal to the plane of the wafer. Accordingly, the bottoms of the first set of trenches are doped. The sacrificial oxide layer, barrier layer and resist are then removed and an additional sacrificial oxide layer, barrier layer and resist layer are deposited and patterned such that both the first and second set of trenches are exposed.

At 516, the gate trench mask is removed utilizing an appropriate resist stripper or a resist ashing process. At 518, a dielectric is formed on the walls of the first and second set of trenches. In one implementation, the dielectric is formed by oxidizing the surface of the silicon to form a silicon dioxide layer. The resulting dielectric along the trench walls forms a gate region dielectric.

At 520, a polysilicon layer is deposited in the first and second set of trenches to form a gate region. In one implementation, the polysilicon is deposited in the trenches by a method such as decomposition of silane ($SiH_4$). The polysilicon is doped with n-type impurity such as phosphorous or arsenic. The polysilicon may be doped by introducing the impurity during the deposition process.

At 522, an etch-back process is performed to remove excess polysilicon on the surface of the wafer and the first barrier layer. In one implementation, the excess polysilicon and the barrier layer are removed by a chemical mechanical polishing (CMP) process.

At 526, a second photo-resist is deposited and patterned to form a body region mask. The body region mask defines a plurality of cells, which are defined by the area inside the gate region. At 530, the exposed portion of the epitaxial deposited semiconductor layer is doped to form body regions in the plurality of cells. In one implementation, the doping process implants a p-type impurity, such as boron, in the upper portion of the epitaxial deposited semiconductor layer. A high temperature thermal cycle may be utilized to drive in the body region doping. Accordingly, the lower portion of the epitaxial deposited semiconductor layer forms a lightly doped second drain portion. At 532, the body region mask is removed.

A third photo-resist is deposited and patterned to form a source region mask, at 536. The source region mask defines a source region in each cell adjacent the gate oxide region. At 540, the portion of the first semiconductor layer, left exposed by the source region mask, is doped to form source regions. In one implementation, the doping process comprises heavily implanting an n-type impurity, such as phosphorous, into the plurality of cells adjacent the gate oxide region. A high temperature thermal cycle may be utilized to drive in the source region doping. At 542, the source region mask is removed.

At 544, a dielectric layer is deposited upon the wafer. In one implementation, the dielectric layer is deposited by decomposition of tetraethylorthosilicate (TEOS) in a chemical vapor deposition (CVD) system.

At 548, a fourth photo-resist layer is deposited and patterned to define a source-body contact mask above each cell. At 550, the portion of the dielectric layer left exposed by the source-body contact mask is etched. The source-body contact mask is removed at 552.

At 554, a source-body metal layer is deposited on the surface of the wafer. In one implementation, the source-body metal layer is deposited by any well-known method such as sputtering. The source-body metal layer forms a contact with the body and source regions left exposed by the patterned dielectric. The source-body metal layer is isolated from the gate region by the patterned dielectric layer. The source-body metal layer is then patterned utilizing a photo-resist mask and selective etching method as needed, at 556.

At 558, fabrication continues with various other process. The various processes typically include etching, deposition, doping, cleaning, annealing, passivation, cleaving and/or the like.

Figure 6A:
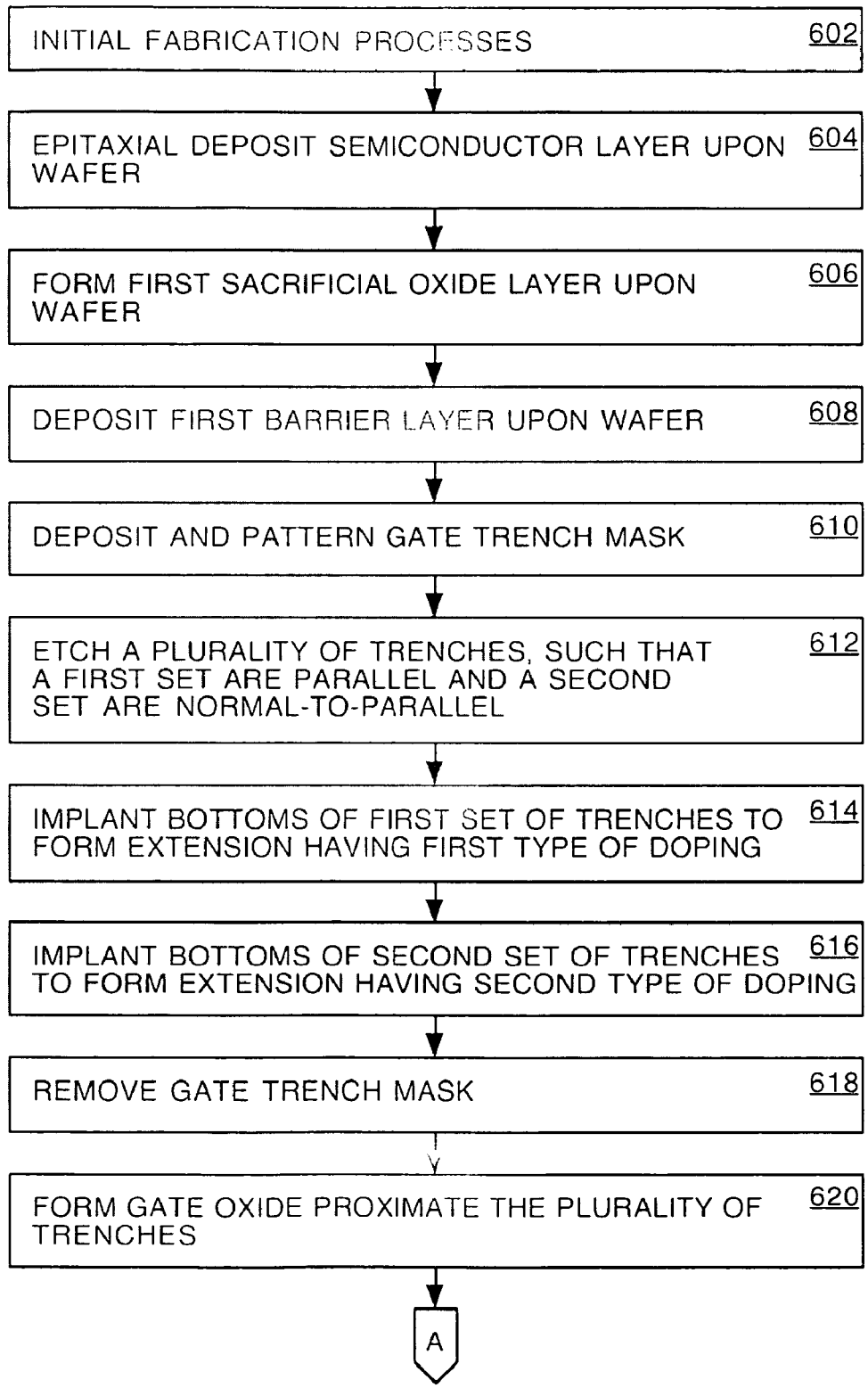
FIGS. 6A-6C show a flow diagram of another method of fabricating a closed cell TMOSFET, in accordance with one embodiment of the present invention.
Figure 6B:
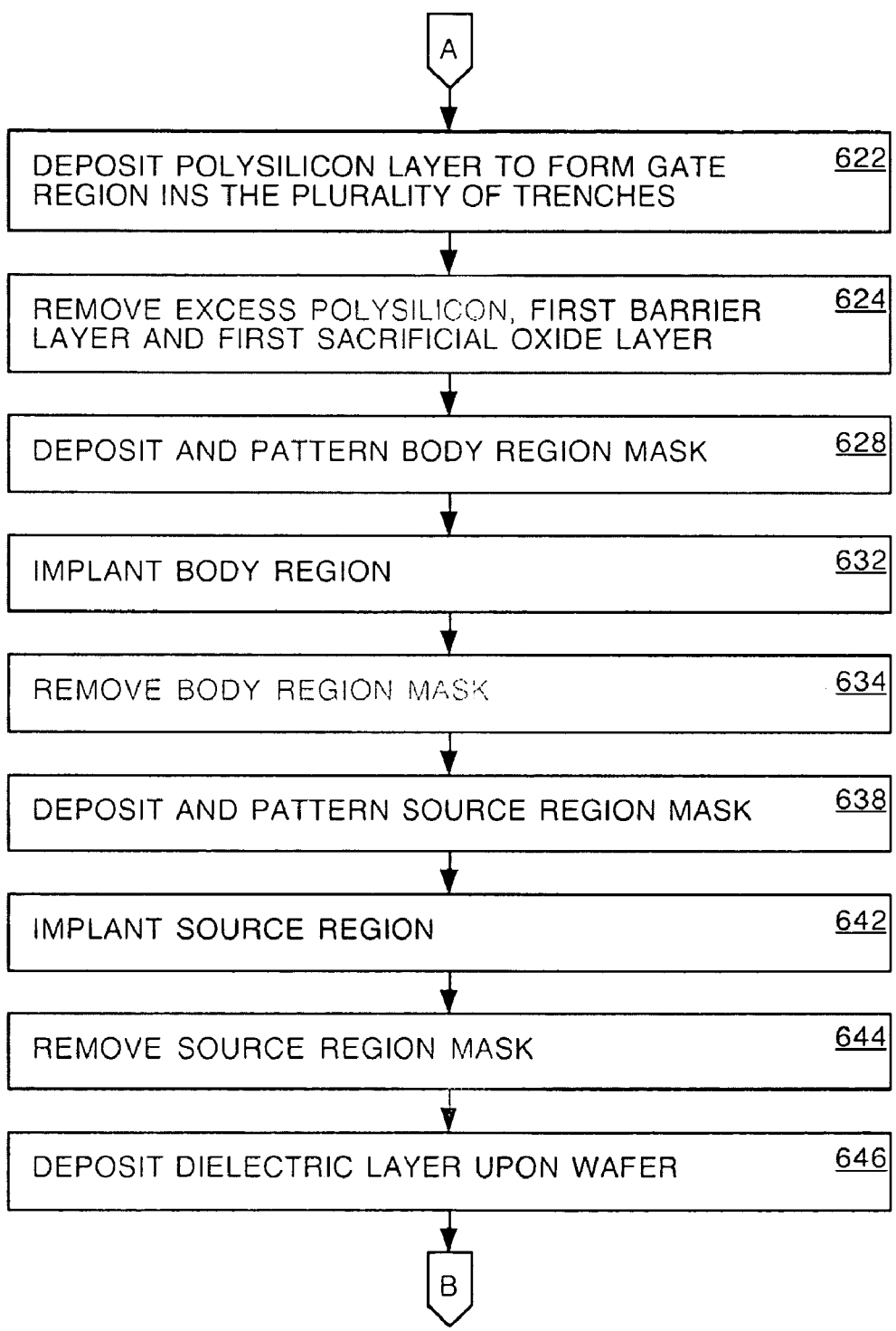
Figure 6C:
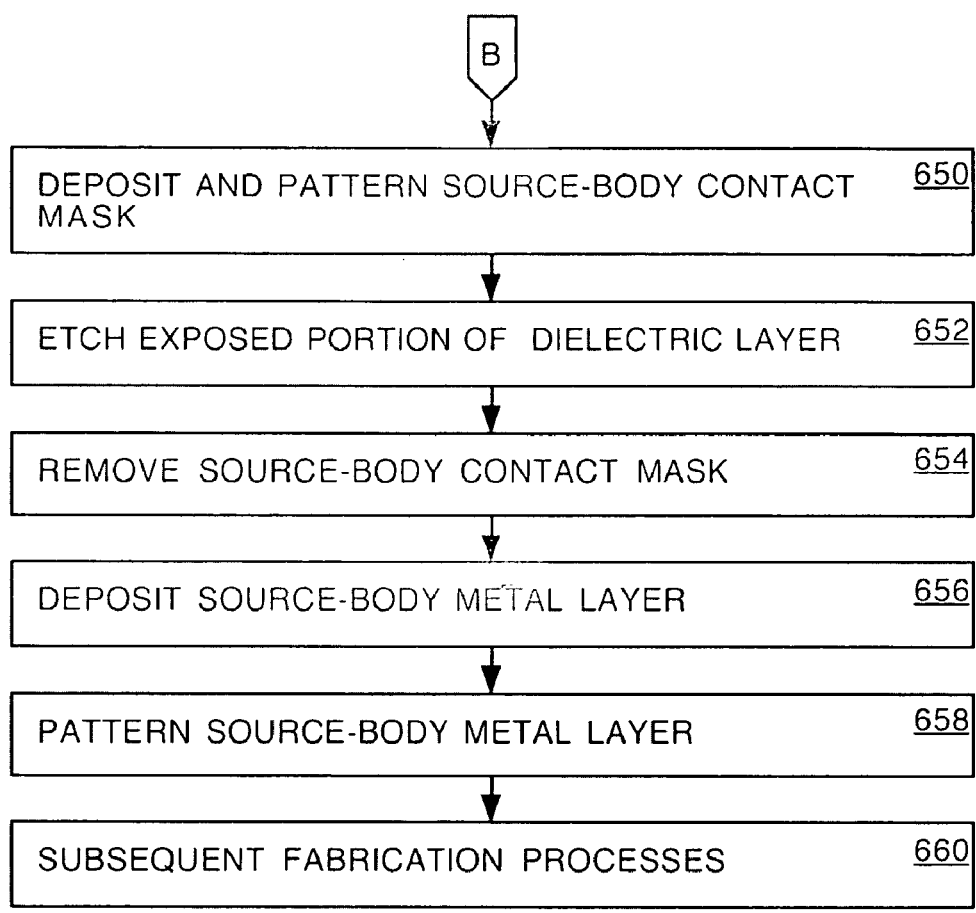

Referring now to FIGS. 6A-6C, a flow diagram of a method of fabricating a closed cell trench metal-oxide-semiconductor field effect transistor (TMOSFET), in accordance with one embodiment of the present invention, is shown. As depicted in FIGS. 6A-6C, the process begins, at 602, with various initial processes upon a substrate, such as cleaning, depositing, doping, etching and/or the like. The semiconductor substrate comprises a first portion of a heavily doped drain region. In one implementation, the first portion of the drain region comprises silicon heavily doped with phosphorous (N+).

At 604, a semiconductor layer is epitaxial deposited upon the substrate. In one implementation, the first semiconductor layer comprises silicon lightly doped with phosphorous. The epitaxial deposited silicon may be doped by introducing the desired impurity, such as phosphorous, into the reaction chamber.

At 606, a sacrificial oxide layer is formed upon the epitaxial deposited semiconductor layer. In one implementation, the sacrificial oxide is formed by oxidizing the surface of the epitaxial deposited silicon layer. At 608, a barrier layer is deposited upon the sacrificial oxide layer. In one implementation, the barrier layer is deposited by chemical vapor deposition (CVD) of silicon nitride ($SiN_4$).

At 610, a photo-resist is deposited and patterned by any well-known lithography process to form a gate trench mask. At 612, the exposed portions of the barrier layer, sacrificial oxide layer and a portion of the first semiconductor layer are etched by any-well known isotropic etching method. In one implementation, an ionic etchant interacts with the barrier, sacrificial oxide layer and first semiconductor layer exposed by the patterned resist layer. A plurality of trenches are formed, such that a first set of trenches are substantially parallel to each other and a second set of trenches are substantially normal-to-parallel with respect to the first set of trenches.

At 614, a first trench bottom doping is performed in the first set of the trenches. In one implementation an n-type impurity, such as phosphorous, is selectively implanted utilizing any well-known ion-implant process. The doping process results in the formation of an n-doped region that extends downwardly from the bottoms of the first set of trenches. In one embodiment, the implant ion flux is oriented at a first angle with respect to the plane of the wafer. The first angle of incident is selected such that the impurity is implanted in the first set of trench bottoms, while the second set of trench bottoms are not doped with the n-type impurity.

At 616, a second trench bottom doping is performed in the second set of trenches. In one implementation a p-type impurity, such as boron, is selectively implanted utilizing any well-known ion-implant process. The doping process results in the formation of a p-doped region that extends downwardly from the bottoms of the second set of trenches. In one embodiment, the implant ion flux is oriented at a second angle with respect to the plane of the wafer. The second angle of incident is selected such that the impurity is implanted in the second set of trench bottoms, while the first set of trench bottoms are not doped with the p-type impurity.

Utilizing a first and second ion implant process wherein the ion flux is incident upon the wafer at an appropriate first and second angle, respectively, is advantageous in that the patterned photo-resist, barrier layer and sacrificial oxide layer is utilized as a mask for both the etching process of 612, the implanting process of 614 and 616, and the subsequent oxidation process of 620. Utilizing an ion implant process wherein the ion flux is incident upon the wafer at an appropriate first and second angle is also advantageous in that the trench implant is self-aligned with the first and second set of trenches, respectively.

At 618, the gate trench mask is removed utilizing an appropriate resist stripper or a resist ashing process. At 620, a dielectric is formed on the walls of the first and second set of trenches. In one implementation, the dielectric is formed by oxidizing the surface of the silicon to form a silicon dioxide layer. The resulting dielectric along the trench walls forms a gate region dielectric.

At 622, a polysilicon layer is deposited in the first and second set of trenches to form a gate region. In one implementation, the polysilicon is deposited in the trenches by a method such as decomposition of silane ($SiH_4$). The polysilicon is doped with n-type impurity such as phosphorous or arsenic. The polysilicon may be doped by introducing the impurity during the deposition process.

At 624, an etch-back process is performed to remove excess polysilicon on the surface of the water and the barrier layer. In one implementation, the excess polysilicon and the barrier layer are removed by a chemical mechanical polishing (CMP) process.

At 628, a second photo-resist is deposited and patterned to form a body region mask. The body region mask exposes a plurality of cells, which are defined by the area inside the gate region. At 632, the exposed portion of the first semiconductor layer is doped to form body regions in the plurality of cells. In one implementation, the doping process implants a p-type impurity, such as boron, from the surface of the wafer to just bellow the bottoms of the gate dielectric region. A high temperature thermal cycle may be utilized to drive in the body region doping. At 634, the body region mask is removed.

A third photo-resist is deposited and patterned to form a source region mask, at 638. The source region mask defines a source region in each cell adjacent the gate oxide region. At 642, the portion of the first semiconductor layer, left exposed by the source mask, is doped to form source regions. In one implementation, the doping process comprises heavily implanting an n-type impurity, such as phosphorous, into the plurality of cells adjacent the gate oxide region. A high temperature thermal cycle may be utilized to drive in the source region doping. At 644, the source mask is removed.

At 646, a dielectric layer is deposited upon the wafer. In one implementation, the dielectric layer is deposited by decomposition of tetraethylorthosilicate (TEOS) in a chemical vapor deposition (CVD) system.

A fourth photo-resist is deposited and patterned to define a source-body contact mask above each cell, at 650. At 652, the portion of the dielectric layer left exposed by the source-body contact mask is etched. At 654, the source-body contact mask is removed.

At 656, a source-body metal layer is deposited on the surface of the wafer. In one implementation, the source-body metal layer is deposited by any well-known method such as sputtering. The source-body metal layer forms a contact with the body and source regions left exposed by the patterned dielectric. The source-body metal layer is isolated from the gate region by the patterned dielectric layer. The source-body metal layer is then patterned utilizing a photo-resist mask and selective etching method as needed, at 658.

At 660, fabrication continues with various other processes. The various processes typically include etching, deposition, doping, cleaning, annealing, passivation, cleaving and/or the like.

Figure 7A:
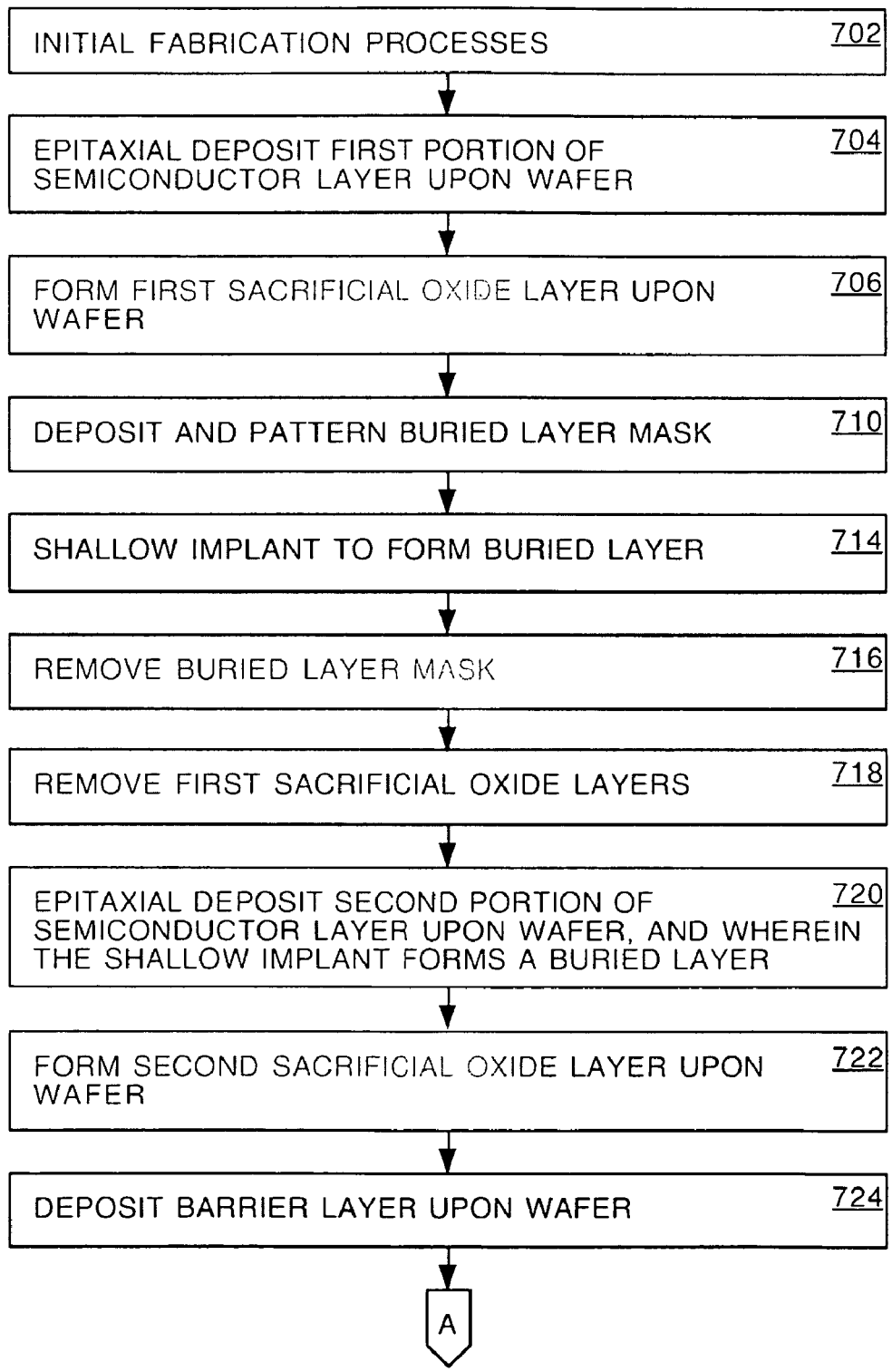
FIGS. 7A-7C show a flow diagram of another method of fabricating a closed cell TMOSFET, in accordance with one embodiment of the present invention.
Figure 7B:
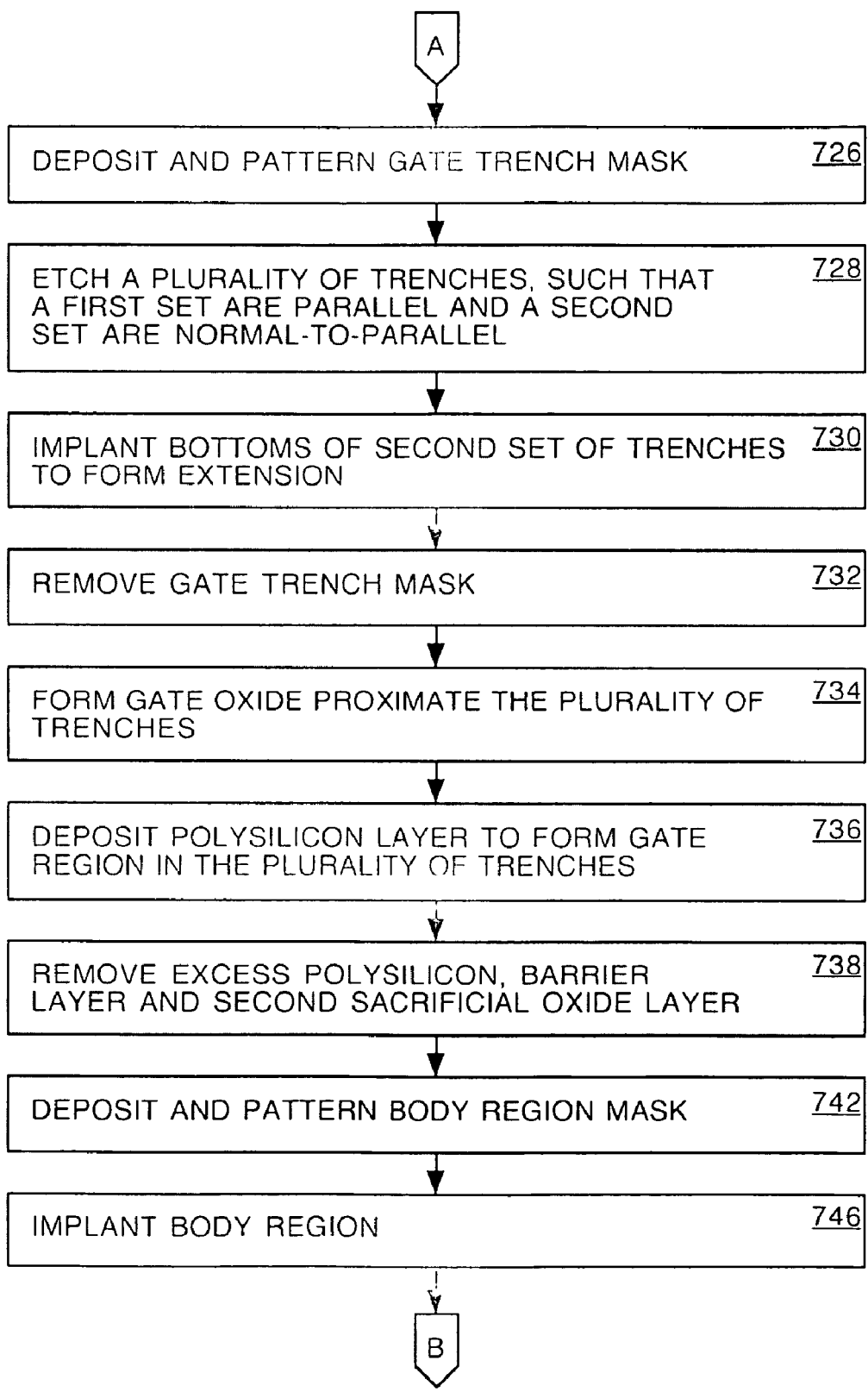
Figure 7C:
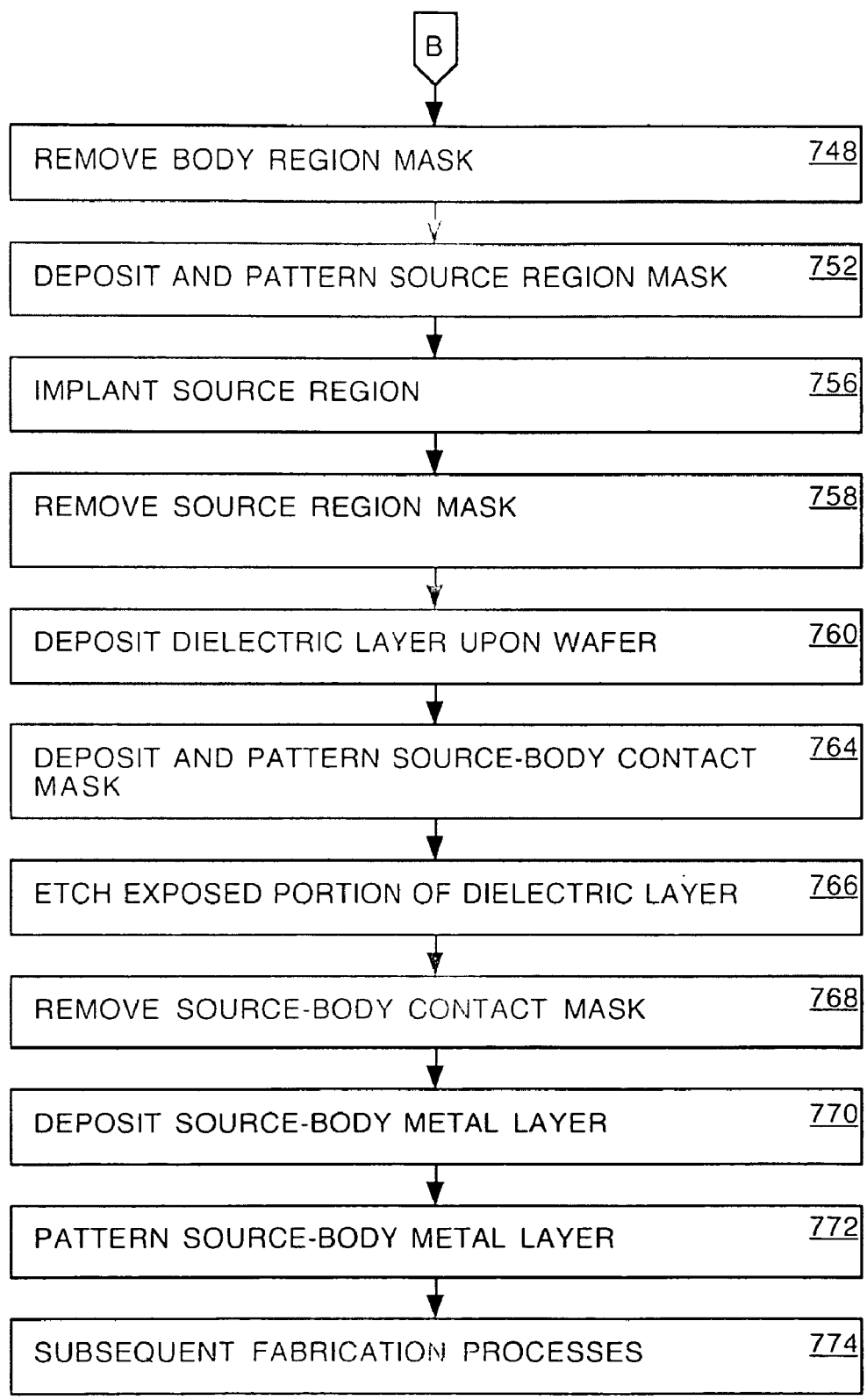

Referring now to FIGS. 7A-7C, a flow diagram of a method of fabricating a closed cell trench metal-oxide-semiconductor field effect transistor (TMOSFET), in accordance with one embodiment of the present invention, is shown. As depicted in FIGS. 7A-7C, the process begins, at 702, with various initial processes upon a substrate, such as cleaning, depositing, doping, etching and/or the like. The semiconductor substrate comprises a first portion of a heavily doped drain region. In one implementation, the first portion of the drain region comprises silicon heavily doped with phosphorous (N+).

At 704, a first portion of a semiconductor layer is epitaxial deposited upon the substrate. In one implementation, the first portion of the semiconductor layer comprises silicon lightly doped with phosphorous. The epitaxial deposited silicon may be doped by introducing the desired impurity, such as phosphorous, into the reaction chamber.

At 706, a sacrificial oxide layer is formed upon the first portion of the semiconductor layer. In one implementation, the sacrificial oxide is formed by oxidizing the surface of the first portion of the epitaxial deposited first semiconductor layer. At 710, a photo-resist is deposited and patterned to form a buried layer mask.

At 714, a shallow implant process is performed to form a plurality of shallow doped regions, which are substantially parallel to each other. In one implementation an n-type impurity, such as phosphorous, is selectively implanted utilizing any well-known ion-implant process.

At 716, the patterned resist is removed utilizing an appropriate resist stripper or a resist ashing process. At 718, the sacrificial oxide layer is removed utilizing a chemical mechanical polishing (CMP) process.

At 720, a second portion of the semiconductor layer is epitaxially deposited upon the substrate. The thermal cycle of the second portion of the epitaxial process and other subsequent thermal cycles causes the shallow doped regions to diffuse to form an n-doped buried layers extending up to the bottom of the subsequently formed first set of trenches.

At 722, a second sacrificial oxide layer is formed upon the epitaxial semiconductor layer. At 724, a barrier layer is deposited upon the second sacrificial oxide layer. In one implementation, the barrier layer is deposited by chemical vapor deposition (CVD) of silicon nitride ($SiN_4$). At 726, a second photo-resist is deposited upon the barrier layer and patterned to form a gate trench mask.

At 728, the exposed portions of the barrier layer, second sacrificial oxide layer and semiconductor layer are etched by any-well known isotropic etching method. A plurality of trenches are formed, such that a first set of trenches are substantially parallel to each other and a second set of trenches are substantially normal-to-parallel with respect to the first set of trenches. Each of the first set of trenches is also substantially aligned to a respective one of the plurality of buried layer.

At 730, a trench bottom doping is performed in the second set of the trenches. In one implementation a p-type impurity, such as boron, is selectively implanted utilizing any well-known ion-implant process. The implant ion flux is orientated at an angle with respect to the plane of the wafer. The angle of incident is selected such that the impurity is implanted to the second set of trench bottoms, while the first set of trench bottoms are not doped. More specifically, if the surface of the barrier layer lies in an x-y plane, the first set of trenches lie in x-z planes and the second set of trenches lie in y-z planes, the angle of orientation is such that the ion flux travels in the y and z directions and not in the x direction. Accordingly, the dopant reaches the bottoms of the second set of trenches. The barrier layer and/or the sacrificial oxide layers, however, capture the dopant along the first set of trenches. Thus, the dopant does not reach the bottoms of the first set of trenches. The angle of incident is selected as a function of the width of the trenches and the thickness of the barrier and/or sacrificial oxide layer. The doping process results in the formation of a p-doped region extending down from the bottoms of the second set of trenches.

Utilizing an ion implant process wherein the ion flux is incident upon the wafer at an appropriate angle is advantageous in that the patterned photo-resist, barrier layer and sacrificial oxide layer are utilized as a mask for both the etching process of 728, the implanting of 730 and the subsequent oxidation process of 734. Utilizing an ion implant process wherein the ion flux is incident upon the water at an appropriate angle is also advantageous in that the trench implant is self-aligned with the second set of trenches, and the first set of trench bottoms are not doped.

At 732, the second resist layer is removed. At 734, a dielectric is formed on the walls of the first and second set of trenches. In one implementation, the dielectric is formed by oxidizing the surface of the silicon to form a silicon dioxide layer. The resulting dielectric along the trench walls forms a gate region dielectric.

At 736, a polysilicon layer is deposited in the first and second set of trenches to form a gate region. In one implementation, the polysilicon is deposited in the trenches by a method such as decomposition of silane ($SiH_4$). The polysilicon is doped with n-type impurity such as phosphorous or arsenic. The polysilicon may be doped by introducing the impurity during the deposition process. At 738, an etch-back process is performed by remove excess polysilicon on the surface of the wafer, barrier layer and second sacrificial oxide layer.

At 742, a third photo-resist is deposited and patterned to form a body region mask. The body region mask exposes a plurality of cells, which are defined by the area inside the gate region. At 746, the exposed portion of the epitaxial deposited semiconductor layer is doped to form body regions in the plurality of cells. In one implementation, the doping process implants a p-type impurity, such as boron, from the surface to just bellow the bottoms of the gate dielectric region. A high temperature thermal cycle may be utilized to drive in the gate region doping. At 748, the body region mask is removed.

A fourth photo-resist is deposited and patterned to form a source region mask, at 752. The source region mask defines a source region in each cell adjacent the gate oxide region. At 756, the portion of the epitaxial deposited semiconductor layer, left exposed by the source region mask, is doped to form source regions. In one implementation, the doping process comprises heavily implanting an n-type impurity, such as phosphorous, into the plurality of cells adjacent the gate oxide region. A high temperature thermal cycle may be utilized to drive in the source region doping. At 758, the source region mask is removed.

At 760, a dielectric layer is deposited upon the wafer. In one implementation, the dielectric layer is deposited by decomposition of tetraethylorthosilicane (TEOS) in a chemical vapor deposition (CVD) system.

A fifth photo-resist is deposited and patterned to define a source-body contact mask above each cell, at 764. At 766, the portion of the dielectric layer left exposed by the source-body contact mask are etched. The source-body contact mask is removed, at 768.

At 770, a source-body metal layer is deposited on the surface of the wafer. In one implementation, the source-body metal layer is deposited by any well-known method such as sputtering. The source-body metal layer forms a contact with the body and source regions left exposed by the patterned dielectric. The source-body metal layer is isolated from the gate region by the patterned dielectric layer. The source-body metal layer is then patterned utilizing a photo-resist mask and selective etching method as needed, at 722.

At 774, fabrication continues with various other processes. The various processes typically include etching, deposition, doping, cleaning, annealing, passivation, cleaving and/or the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabricating a closed cell trench metal-oxide-semiconductor field effect transistor (TMOSFET) comprising:
   depositing a first semiconductor layer upon a substrate, wherein said first semiconductor layer is doped with a first type of impurity;
   etching a plurality of trenches in said first semiconductor layer, wherein a first set of said plurality of trenches are substantially parallel with respect to each other and a second set of said plurality of trenches are substantially normal-to-parallel with respect to said first set of said plurality of trenches;
   forming a dielectric proximate said plurality of trenches;
   doping said first semiconductor layer proximate the bottoms of said first set of said plurality of trenches with said first type of impurity;
   doping said first semiconductor layer proximate the bottoms of said second set of said plurality of trenches with a second type of impurity;
   depositing a second semiconductor layer in said plurality of trenches;
   doping a first portion of said first semiconductor layer with said second type of impurity, wherein the first portion of said first semiconductor layer extends below said plurality of trenches; and
   doping a second portion of said first semiconductor layer proximate said dielectric with said first type of impurity.

2. The method according to claim 1, wherein said depositing said first semiconductor layer comprises epitaxial depositing silicon lightly doped with phosphorous.

3. The method according to claim 1, wherein:
   said doping said first semiconductor layer proximate the bottoms of said first set of said plurality of trenches comprises implanting said first type of impurity at a first angle such that said first type of impurity is implanted in said first set of said plurality of trenches and not in said second set of said plurality of trenches; and
   said doping said second semiconductor layer proximate the bottoms of said second set of said plurality of trenches comprises implanting said second type of impurity at a second angle such that said second type of impurity is implanted in said second set of said plurality of trenches and not in said first set of said plurality of trenches.

4. The method according to claim 1, wherein:
   said doping said first semiconductor layer proximate the bottoms of said first set of said plurality of trenches comprises implanting phosphorous; and
   said doping said first semiconductor layer proximate the bottoms of said second set of said plurality of trenches comprises implanting boron.

5. The method according to claim 4, wherein said doping said first portion of said first semiconductor layer with said second type of impurity comprises implanting boron to form a body region.

6. The method according to claim 5, wherein said doping a second portion of said first semiconductor layer proximate said dielectric with said first type of impurity comprises implanting phosphorous to form a source region.

7. The method according to claim 1, wherein said forming a dielectric proximate said plurality of trenches comprises oxidizing said first semiconductor layer proximate said plurality of trenches.

8. The method according to claim 1, wherein said depositing said second semiconductor layer in said plurality of trenches comprises chemical vapor depositing polysilicon heavily doped with phosphorous.

9. A method of fabricating a closed cell trench metal-oxide semiconductor field effect transistor (TMOSFEET) comprising:
   depositing a first portion of a first semiconductor layer upon a substrate, wherein said first semiconductor layer is doped with a first type of impurity;
   doping said first portion of said first semiconductor layer, wherein a plurality of buried doped regions are formed in said first portion of said first semiconductor layer;
   depositing a second portion of said first semiconductor layer upon said first portion of said first semiconductor layer;
   etching a plurality of trenches in said first semiconductor layer, wherein a first set of said plurality of trenches are substantially parallel with respect to each other and said plurality of buried doped regions are aligned proximate the bottom of said first set of said plurality of trenches, and wherein a second set of said plurality of trenches are substantially normal-to-parallel with respect to said first set of said plurality of trenches;

doping said first semiconductor layer aligned proximate the bottoms of said second set of said plurality of trenches with an impurity type opposite said plurality of buried doped regions;

forming a dielectric proximate said plurality of trenches;

depositing a second semiconductor layer in said plurality of trenches;

doping a body region of said first semiconductor layer between said plurality of trenches with a second type of impurity; and doping a source region of said first semiconductor layer between said plurality of trenches and said first region of said first semiconductor layer.

10. The method according to claim 9, wherein said depositing said first semiconductor layer comprises epitaxial depositing a semiconductor material lightly doped with said first type of impurity.

11. The method according to claim 10, wherein said doping said body region of said first semiconductor layer comprises implanting said second type of impurity.

12. The method according to claim 11, wherein said doping said source region of said first semiconductor layer comprises implanting said first type of impurity.

13. The method according to claim 12, wherein said substrate is doped with said first type of impurity.

14. The method according to claim 13, wherein:
said plurality of buried doped regions are doped with said first type of impurity; and
said first semiconductor layer proximate the bottoms of said second set of said plurality of trenches are doped with said second type of impurity.

15. The method according to claim 14, wherein said doping said second semiconductor layer proximate the bottoms of said second set of said plurality of trenches comprises implanting said second type of impurity at a second angle such that said second type of impurity is implanted in said second set of said plurality of trenches and not in said first set of said plurality of trenches.

16. The method according to claim 15, wherein said etching said plurality of trenches is performed until the bottoms of said plurality of trenches extend to said plurality of buried doped regions.

* * * * *